United States Patent [19]

Arnold

[11] 4,259,409

[45] Mar. 31, 1981

[54] ELECTROLESS PLATING PROCESS FOR GLASS OR CERAMIC BODIES AND PRODUCT

[75] Inventor: Anthony F. Arnold, Ringoes, N.J.

[73] Assignee: SES, Incorporated, Newark, Del.

[21] Appl. No.: 127,676

[22] Filed: Mar. 6, 1980

[51] Int. Cl.[3] .............................................. C23C 3/02
[52] U.S. Cl. ..................................... 428/428; 427/98;
427/108; 427/123; 427/125; 427/169; 427/229;
427/304; 427/305; 427/397.8; 427/404;
428/434; 428/448; 428/450; 204/38 B
[58] Field of Search .................... 427/98, 397.8, 376.3,
427/92, 304, 305, 125, 229, 108, 123, 169, 404;
106/1.11, 74, 84; 204/38 B; 428/428, 434, 448,
450

[56] References Cited

U.S. PATENT DOCUMENTS

| | | | |
|---|---|---|---|
| 3,226,256 | 12/1965 | Schneble et al. | 427/98 |
| 3,337,365 | 8/1967 | Mones | 427/125 |
| 3,494,790 | 2/1970 | Rice | 427/305 |
| 3,535,146 | 10/1970 | Flicker | 427/229 |
| 3,697,319 | 10/1972 | Feldstein | 427/304 |
| 4,008,343 | 2/1977 | Cohen | 427/305 |
| 4,054,693 | 10/1977 | Leech et al. | 427/304 |
| 4,098,949 | 7/1978 | Kosiorek | 427/125 |
| 4,126,713 | 11/1978 | DiBugnara | 427/125 |

*Primary Examiner*—Ralph S. Kendall

[57] ABSTRACT

Strongly adherent layers of electroless metals on glass or ceramic substrates are obtained by first applying a film of an alkali metal silicate solution containing dissolved therein a catalytically effective amount of nickel, palladium or platinum to the substrate, drying and firing the film onto the substrate and electroless plating the coated substrate.

12 Claims, No Drawings

ELECTROLESS PLATING PROCESS FOR GLASS OR CERAMIC BODIES AND PRODUCT

BACKGROUND OF THE INVENTION

1. Field of the Invention

This invention relates to a process for forming a strongly adherent layer of electroless metal on a glass or ceramic substrate and the objects made thereby.

2. Background

Electroless plating, a term coined by its inventor Brenner, covers processes in which a metal compound is reduced to the metallic state by means of a chemical reducing agent in the solution thereby depositing a metal film on an appropriate surface. One problem in electroless plating is finding suitable methods for treating the surface to be plated to make it catalytic for deposition of metal from the plating bath. One solution is suggested in U.S. Pat. No. 4,008,343 which uses colloidal palladium/tin ions. Another problem is to provide a surface treatment which results in a strongly adherent metallic film. U.S. Pat. No. 4,054,693, for example, provides a special electroless plating composition to produce strongly adherent layers of metal on resinous bodies.

SUMMARY OF THE INVENTION

This invention provides a method whereby glass or ceramic bodies are treated to make them catalytic to electroless deposition as well as to provide a strongly adherent bond between the electroless metal plate and the glass or ceramic body. Basically, the process entails applying a coating or film of an alkali metal silicate solution containing dissolved therein a metal salt, which, when reduced, is catalytic to the deposition of metal from an electroless plating solution, to the glass or ceramic body, drying and heating the coated body and then electrolessly plating the coated body. The electroless plating so produced is strongly attached to the glass or ceramic body and may for example, be left as is for decorative purposes, or, further built up with electroplating to be used in printed circuits and similar electrical devices.

DESCRIPTION OF THE PREFERRED EMBODIMENTS

The Substrate

The substrates to be electroless coated by the process of the instant invention are inorganic, nonmetallic bodies. These are typically glass or ceramic bodies. They may be monolithic or coated with a glass or ceramic. Typical glasses are the vitreous silicas with or without various stabilizer or viscosity reducing agents. Included within the glasses are the glazes which are applied to various ceramics, claywares or metal bodies to provide an impervious surface. Ceramics are typically crystalline oxide bodies such as alumina, magnesia, alumina/silica, crystalline quartz, etc. Further included under the term ceramics are structural clay products, whitewares, glass-ceramics and other refractory materials such as nitrides, carbides, borides and silicides.

The Silicate Film

The silicates used to form the silicate films of the instant invention are aqueous solutions of the alkali metal silicates, i.e. lithium, sodium, potassium, rubidium or cesium silicates. Preferred are lithium, sodium and potassium with the more economical sodium form preferred. These soluble silicate solutions, once widely known as "waterglass", are well known and available commercially. These solutions may contain colloidal silica suspended therein. These colloidal silica-containing silicate solutions are also obtainable commercially or may be readily prepared by the controlled addition of the alkali metal silicate to an acidified or buffered aqueous solution, preferably a dilute acid solution. Preferably the silicate solution contains from about 1 to about 85 percent by weight of its silica content in the form of colloidal silica. The preferred solutions contain a total concentration of silica (with the silicate measured as silica) of between about 5 to about 85, preferably between about 25 to about 53 gms/liter. Typically, the silica to alkali metal ratio ($SiO_2:M_2O$) in the solution will range from about 1:1 to about 22:1, preferably from about 1.5:1 to about 5:1.

Dissolved within the silicate solution is a metal salt, which, when reduced, is catalytic to the deposition of metal from an electroless plating solution. The metal of the metal salt may be the same as the metal to be plated from the electroless bath or may be different. Particularly preferred salts are those of palladium or nickel or mixtures thereof. Palladium is most preferred. The use of palladium salt, preferably chloride, allows a much greater range of conditions for successful plating catalysis and adhesion, compared to nickel salts.

The metal salts utilized should be soluble in the aqueous silica solution and must be capable of being reduced to the metal by the application of an appropriate reducing agent to the fired silicate coating.

When palladium salts are utilized, preferred are palladium chloride, palladium bromide, palladium chloride bromide or mixtures thereof. Palladium chloride salt is readily available and is preferred. When the chloride is used it has been found that the addition of bromide ion has a tendency to decrease the silicate instability or tendency to gel. This is postulated to be attributable to palladium ion complexation or perhaps formation of negatively charged ions in solution, e.g. $PdCl_2Br^-$, which would be repelled by negatively charged silica/silicate particles. An equimolar addition of bromide ion, such as lithium bromide, to palladium chloride is preferred. Iodide is to be avoided because palladium iodide is insoluble in water. Ammonia or ammonium ion complexes the palladium ions so strongly that the silicate solution is rendered more stable. However, the resulting palladium ion is not reducible by hypophosphite so that no catalysis is observed using typical art plating. Solutions containing hypophosphite with other complexing agents, which do not hinder the reduction may be used.

The concentration of the metal salt in the silicate solution must be at least at a catalytically effective level, which can readily be determined by routine experimentation. Concentration ranges from about 0.001 to about 0.06 moles/liter, more preferably from about 0.01 to about 0.02 moles/liter are generally effective.

For maximum catalytic activity and plating adhesion, the pH of the silicate solution should range from about 10 to about 11. Above pH 11, a decrease in catalytic activity and poorer adhesion are noted. The pH of the solution is readily adjusted with acid, say HCl or $H_2SO_4$. The addition of too much acid, however, causes gelling of the solutions before they can conveniently be used.

Small amounts of thickening agents such as hydroxylated cellulose may be added to the silicate solution to make them easier to apply. However, extreme care and lower temperatures, near 200° C. must by used in the subsequent heating step to prevent the decomposing thickening agent from disrupting the silicate film and causing poor adhesion. Small amounts of surfactants may be used to improve the spreading of the silicate solution without producing any deleterious effects.

The catalyst-containing silicate solution is applied to the cleaned glass or ceramic substrate in any manner of traditional ways, as for example, by dipping, brushing, rolling, silk screening, spraying and the like. The silicate film may be applied by the application of a single or multiple coats and may be applied in a patterned coating to the substrate to allow for a patterned metal coating. Coating thicknesses in the range of about 2000 Å and up are found to produce excellent plating adhesion. Generally, the upper limit is set by the tendency of the silicate to mudcrack and flake off as it dries and before it can be fired onto the surface. The thickness of the applied silicate film ranges from about 500 to about 8000 Å, preferably from about 1500 to about 3000 Å.

In practicing the present invention, the substrate to be coated should be thoroughly cleaned. Generally, conventional cleaning methods are satisfactory. Such cleaning can include mechanical cleaning, scrubbing, organic solvents, alkaline or acid cleaners, wetting agents, and pickling baths, with suitable rinsing between steps.

Firing of the Silicate Coating

The applied silicate/catalyst salt solution is dried and fired onto the glass or ceramic substrate. Drying temperatures are not critical. The coated substrate may be dried in air, or other atmosphere or in a vacuum. Blowing dry air is a suitable drying method. Heating the air accelerates the drying. Drying can be accomplished at room temperature (say, 25° C.) up to about 200° C. for about 0.1 to about 100 hours, depending on the temperature. The drying step is conveniently combined with the firing step. The purpose of the firing step is to react the silicate/catalyst salt film with itself and the substrate forming a coherent bond therewith. The firing step is carried out at a temperature ranging from about 150° to about 500° C., preferably from about 200° to about 300° C. The firing may be carried out in air although other atmospheres including vacuum may be suitably utilized. The times of firing are not critical and depend on the temperature, 0.1 to 10 hours normally being suitable.

Electroless Plating

Prior to electroless plating, the fired substrate may be subjected to a reducing agent to reduce the metal salt thereby activating it for the subsequent electroless plating. These reducing agents may be, for example, aqueous solutions of reducing agents having pH values of less than 11. The pH must be maintained below 11, preferably below 10.5 to prevent attack of the silicate film. A typical aqueous reducing solution is sodium hypophosphite at about 100 gm/liter, buffered to pH 6–7 using a suitable buffer such as citrate, pyrophosphate, etc. Aqueous solutions of the organic boranes are also suitable such as dimethylamine borane, trimethylamine borane, diethylamine borane, triethylamine borane and pyridine borane. A suitable nonaqueous reductant solution is for example di-isobutylaluminum hydride in hexane. Reducing gases may also be used such as hydrogen and carbon monoxide.

Preferably this reducing step is combined with the electroless plating step since the electroless plating solutions contain reducing agents capable of reducing the catalytic metal salt in the silicate layer.

The electroless plating baths utilized in this invention can be any of the art recognized baths. The only limitation on the bath is that it can not be operated at a pH so high that corrosive reaction with the silicate film occurs. A pH of less than about 11 is desirable. The following examples illustrate several well-known electroless plating baths that are suitable.

| For Nickel | |
|---|---|
| $NiCl_2 \cdot 6H_2O$ | 30 gm. |
| $NaH_2PO_2 \cdot H_2O$ | 10 gm. |
| Sodium citrate | 10 gm. |
| Water to make 1 liter | |

Operate at about 194° F. and pH 4 to 6

| For Cobalt | |
|---|---|
| $CoCl_2 \cdot 6H_2O$ | 30 gm. |
| $NaH_2PO_2 \cdot H_2O$ | 10 gm. |
| Sodium Citrate | 10 gm. |
| Water to make 1 liter | |

Operate at about 194° F. and pH 9 to 10
Adjust pH with $NH_4OH$: solution should be used within about four hours of make-up

| For Nickel | |
|---|---|
| $NiCl_2 \cdot 6H_2O$ | 30 gm. |
| $NaH_2PO_2 \cdot H_2O$ | 20 gm. |
| $NH_4Cl$ | 50 gm. |
| Trisodium Citrate .5½ $H_2O$ | 100 gm. |
| Water to make 1 liter | |

Operate at about 194° F. and pH 8 to 10 or 4 to 5
Adjust pH with ammonium hydroxide

| For Cobalt | |
|---|---|
| $CoCl_2 \cdot 6H_2O$ | 30 gm. |
| $NaHPO_2 \cdot H_2O$ | 20 gm. |
| Rochelle Salts ($NaKC_4H_4O_6 \cdot 4H_2O$) | 200 gm. |
| $NH_4Cl$ | 50 gm. |
| Water to make 1 liter | |

Operate at about 194° F. and pH 9 to 10
Adjust pH with ammonium hydroxide: solution should be used within about four hours of make-up There are other art recognized and proprietary formulas suitable for the electroless plating of this invention. Typically, the thickness of the electroless plate will range from about 500 to about 15,000 Å, more preferably from about 2000 to about 7000 Å.

Utility

The product prepared by the process of this invention may be utilized as for example for decorative purposes, as mirrors, to provide electrical circuits on glass or ceramic substrates, to provide a "solderable" glass or ceramic body, etc.

When desired, additional metal layers are electroplated over the electroless layer. In a specific example, copper may be electroplated from a pyrophosphate type bath, in a manner typical of the manufacture of printed circuits using additive layer technology. This process will find application in the manufacture of electrical circuits, because the method is one applicable to mass production at low cost, and is adaptable for producing a variety of plated metal surfaces to provide both conductivity and solderability. A further application is to the manufacture of solar cells, wherein it is required to seal atmosphere-sensitive semiconductor products, with tempered glass: the relatively low temperatures required by the disclosed process does not cause loss of temper. In fact, diffusion (at these low temperatures) of additional sodium ions, or preferably potassium ions, into the surface of the glass will cause an additional compressive stresses in these surfaces. The process has application, also for use with thin non-tempered glass which is used to make sealed devices e.g., liquid crystals. A further benefit of the metallization system is that the metal surface can be extremely smooth (in contrast to sintered inks for example): this smooth surface makes an excellent substrate for the deposition of other types of thin film, such as semiconductors used in photoelectric devices.

When the electroless plated substrate is to be further electroplated, it is found to be advantageous to heat the coated substrate, prior to electroplating, in an inert atmosphere, such as nitrogen or argon, at a temperature sufficient to develop a strong bond between electroless metal, silicate and substrate, yet not so high as to fully interdiffuse the silicate and substrate surface. Heating to temperatures ranging from about 150° to about 500° C. preferably from about 200° to about 350° C. are satisfactory. The time of heating is dependent on the temperature, the higher the temperature, the shorter the time. Times range from about 0.1 to about 10 hours.

The process of the instant invention and the products made thereby is further described below by the following illustrative embodiments which are provided for illustration and are not to be construed as limiting the invention.

ILLUSTRATIVE EMBODIMENTS

EXAMPLE 1

A tempered soda-lime glass surface was cleaned in a conventional domestic type washer using a commercial phosphate-silicate type detergent. A solution of silicate was applied to the surface of the glass, preheated to approximately 50° C., using a roller. The said solution of silicate had been made in the following steps:
a. A solution of 5% wt. anhydrous $PdCl_2$ in 20% of concentrated (11 N) hydrochloric acid, had been made up and kept in a closed container.
b. An aqueous solution of 5% volume solution (a) above and 5% 1.0 N HCl, balance deionized water was made up.
c. A solution containing 8.9% weight $Na_2O$ and 28.7% weight $SiO_2$ in water was dripped into solution (b) which was stirred continuously. A total volume of the silicate solution amounting to 11% of the volume of the solution (b) was added. This final mixture was sealed in a closed container with twice its volume of air, overnight.

After application of the silicate-palladium film, the glass was allowed to cool, and the film to dry, for one hour. It was then baked in air at 250° C. for 30 minutes. The glass was placed on a rack and immersed in a plating solution at a temperature of 70° C. for four minutes. The composition of the plating solution was as follows:

| | |
|---|---|
| Nickel sulfate, $NiSO_4 \cdot 6H_2O$ | 26.5 gm |
| Glycine, $NH_2CH_2COOH$ | 22.5 gm |
| Potassium Hydroxide KOH | 20 gm |
| Sodium Hypophosphite $NaH_2PO_2H_2O$ | 10 gm |
| Deionized Water to make | 1 liter |

The pH of the solution was 8.7. A bright adherent nickel plating of some 4000 Å thickness was obtained.

In further processing, the nickel plating was baked in nitrogen, with its temperature rising to 300° C. for 20 minutes. The baked nickel plating was electroplated with copper from a pyrophosphate type solution of pH 8.2, initially at 0.2 amps per sq. dm, then at 1.0 amps/sq. dm.

The copper solution contained 31 grams/liter copper as copper pyrophosphate, 220 grams/liter pyrophosphate. The bath also contained some ammonia and some orthophosphate in lower, less well controlled amounts, as is common in operation of such plating solutions.

Both nickel and copper surfaces were solderable, as shown by dipping plated glass bodies in molten 60% wt. tin/40% wt. lead at 230° C., using common commercial fluxes.

The total possible thickness of the copper plating was found to be limited to under 25 microns due to cracking in the glass induced by the strains in the electroplate.

EXAMPLE 2

A sheet of glass, temperature 40° C., had a silicate solution applied to it by a soft rubber roller, and this was dried with a hand held hot air blower and baked at 210° C. for 30 minutes, and nickel plated substantially as in Example I.

The silicate solution was made as follows:
First, 74.4 gms of $NiSO_4.6H_2O$ were added to 1 liter of 1.1 Normal HCl solution. Then 5 mls of this solution was added to 85 mls of deionized water. The resulting solution contained 3.7 gms of $NiSO_4.6H_2O$ and 2.2. gms HCl per liter and to this solution was added 10 mls of a sodium silicate solution which contained 28.7% wt. silica and 8.9% wt. sodium oxide.

EXAMPLE 3

To 3.5 mls deionized water were added, in order:
(a) 5 mls of lithium polysilicate colloidal solution (containing 20% wt. silica and 2.1% wt lithium oxide),
(b) 1 ml of sodium silicate solution (containing 28.7% wt. silica and 8.9% wt. sodium oxide),
(c) 0.5 mls of an aqueous solution containing 5% wt $PdCl_2$ and 7.4% wt. HCl, and,
(d) 1.0 mls of 1 Normal HCl solution.

The combined solution was applied to a clear microscope slide at 26° C., dried in air and baked at 250° C. for 30 minutes, and then immersed in nickel plating solution as in Examples 1 and 2, rinsed and dried. The nickel plated piece was then baked in nitrogen for 30 minutes at 250° C.

Application of the silicate solution to a thickness ranging from about 300 Å to about 8000 Å produced adherent platings.

EXAMPLE 4

A silicate solution was made up, adding in order:
22.5 mls deionized water
25 mls lithium polysilicate (20% wt. $SiO_2$, 2.1% wt. $Li_2O$)

8.5 mls palladium chloride solution (prepared by adding 6.0 mls 1 Normal HCl to 2.5 mls of a stock solution containing 5%-wt. $PdCl_2$ and 7.4%-wt. HCl in deionized water).

This solution was applied to a clean microscope slide at 26° C., dried in air, and baked at 250° C., and plated as in the previous examples. An adherent plating was obtained.

EXAMPLE 5

To a clean glass microscope slide at room temperature, were applied by rolling two coats of the silicate solution detailed below, using a foam rubber covered roller. The first coating was dried for about 2 minutes in air before the application of the second coating.

To 9 mls of a solution of 0.028 M $NiCl_2$ and 0.028 M $NH_2$—$CH_2COOH$, was added 1 ml of sodium silicate solution (8.9% wt. $Na_2O$, 28.7% wt. $SiO_2$) with stirring. To this was added 0.05 mls of 5% wt. $PdCl_2$ in 20% HCl solution, and then 0.79 mls of 1 N HCl solution. The solution thus contained approximately 0.0013 molar $PdCl_2$ and approximately 0.023 molar nickel chloride.

The glass was allowed to dry for some 40 minutes in air, and fired in nitrogen at 250° C. for 30 minutes, stored under nitrogen, and then plated at 95° C. for 5 minutes in a solution of the following composition:

| | |
|---|---|
| Nickel chloride $NiCl_2 . 6H_2O$ | 30 gms |
| Potassium citrate $K_3C_6H_5O_7 . H_2O$ | 15 gms |
| Sodium acetate $NaCH_3COO . 3H_2O$ | 5 gms |
| Sodium hypophosphite $NaH_2PO_2H_2O$ | 10 gms |
| Deionized water to make 1 liter | |
| pH adjusted to 4.8. | |

An adherent plating, which looked black through the glass, was obtained.

EXAMPLE 6

To determine the adherency of the platings, the following tests were performed. A stranded copper wire, about 1.2 mm. in diameter was soldered to the plating as formed in Examples 1–5 above. The fillet of solder covered an area about 0.625×0.325 cm. The wire was pulled steadily, rotating gently up to an angle of 20° to the perpendicular. Samples prepared according to the instant invention as exemplified in Examples 1–5 require greater than 300 psi pull to separate the wire from the glass. In many cases over 800 psi pull has been required. At these higher levels, the usual mode of fracture is in the body of the glass. Prior art platings, as for example: inversion in colloidal tin chloride solutions, appropriate rinses, immersion in palladium chloride solutions, and various combinations of these processes, also including a substantial range of bakings to try to improve adhesion of films resulting from said processes, fail at levels of 5 p.s.i. or less. The adhesion that was obtained in such examples appeared to be related to physical interlocking on more textured surfaces.

What is claimed is:

1. A process for producing an adherent layer of electroless metal on a glass or ceramic substrate which comprises:
    (a) applying to the substrate at least one coat of an alkali metal silicate solution containing dissolved therein an amount of metal salt selected from nickel, palladium or platinum salts which upon reduction is catalytically effective for activating the deposition of metal from an electroless plating bath
    (b) drying the coated substrate;
    (c) heating the coated substrate at a temperature ranging between about 150° C. to about 500° C.; and
    (d) electrolessly plating the resultant silicate coated substrate using an electroless plating bath having a pH of less than about 10.5.

2. The process of claim 1 wherein the silicate solution contains from about 1 to about 85 percent by weight of its silica content in the form of coloidal silica and has a pH between about 10 and about 11.

3. The process of claim 2 wherein the silicate solution contains between about 5 to about 85 grams/l of silica, and a mole ratio of alkali metal to silica of from about 1:1 to about 22:1 and from about 0.001 to about 0.06 moles/l of metal salts.

4. The process of claim 3 wherein the silicate solution contains between about 25 to about 50 gms/l of silica, a mole ratio of alkali metal to silica of from about 1.5:1 to about 5:1 and from about 0.01 to about 0.02 moles per liter of metal salts.

5. The process of claim 4 wherein the metal salt is selected from nickel, palladium salts, or mixtures thereof.

6. The process of claim 5 wherein the metal salt is a palladium salt.

7. The process of claim 6 wherein the palladium salt is palladium chloride, palladium bromide or mixtures thereof.

8. The process of claim 7 wherein the applied coat of silicate solution after drying has a thickness ranging from about 1500 to about 3000 Å.

9. The process of claim 1 wherein the applied coat of silicate solution after drying has a thickness ranging from about 1500 to about 3000 Å.

10. The process of claim 1 wherein the coated substrate is heated at a temperature ranging between about 200° to about 300° C.

11. The process of claim 1 wherein the electroless plated material is heated to a temperature ranging from about 150° to about 500° C., cooled and subsequently electroplated.

12. A product as prepared by the process of claims 1, 2, 3, 4, 5, 6, 7, 8, 9, 10 or 11.

* * * * *